United States Patent
Joung et al.

(10) Patent No.: US 8,130,884 B2
(45) Date of Patent: Mar. 6, 2012

(54) APPARATUS AND METHOD FOR SYNCHRONIZING SIGNAL ANALYZER

(75) Inventors: Jinsoup Joung, Seongnam (KR); Byungkwan Jang, Seongnam (KR); Kyeongmin Ha, Seongnam (KR); Junwan Park, Seoul (KR)

(73) Assignee: Innowireless Co., Ltd., Seongnam-si (KR)

( * ) Notice: Subject to any disclaimer, the term of this patent is extended or adjusted under 35 U.S.C. 154(b) by 1221 days.

(21) Appl. No.: 11/832,706

(22) Filed: Aug. 2, 2007

(65) Prior Publication Data

US 2008/0031392 A1 Feb. 7, 2008

(30) Foreign Application Priority Data

Aug. 2, 2006 (KR) .................. 10-2006-0073018

(51) Int. Cl.
*H04L 7/00* (2006.01)
(52) U.S. Cl. .................. 375/354; 702/79; 324/76.11
(58) Field of Classification Search .......... 375/224, 375/226, 354; 702/1, 57, 79; 324/76.11, 324/76.12
See application file for complete search history.

(56) References Cited

U.S. PATENT DOCUMENTS

| | | | |
|---|---|---|---|
| 7,225,093 B1 * | 5/2007 | Corredoura | 702/79 |
| 2002/0101840 A1 * | 8/2002 | Davidsson et al. | 370/330 |
| 2007/0150776 A1 * | 6/2007 | Smith et al. | 714/709 |

* cited by examiner

*Primary Examiner* — Kevin M Burd
(74) *Attorney, Agent, or Firm* — Rothwell, Figg, Ernst & Manbeck, P.C.

(57) ABSTRACT

Disclosed herein are an apparatus and method for synchronizing a signal analyzer. The apparatus includes an Analog-to-Digital Converter (ADC), a signal storage unit, a trigger signal generation unit, a signal acquisition control unit, a signal analysis unit, and a time error control unit. The ADC converts the input signal into a corresponding digital signal. The signal storage unit stores therein the digital signal received from the ADC. The trigger signal generation unit generates a trigger signal for each predetermined period. the signal acquisition control unit acquires the digital signal from a signal acquisition time point. The signal analysis unit calculates the start position of a frame from the digital signal. The time error control unit calculates a time error between the time point at which each trigger signal is generated and the start position of the digital signal, and sets a subsequent signal acquisition time point based on the calculated time errors.

3 Claims, 3 Drawing Sheets

[Fig. 1]
PRIOR ART
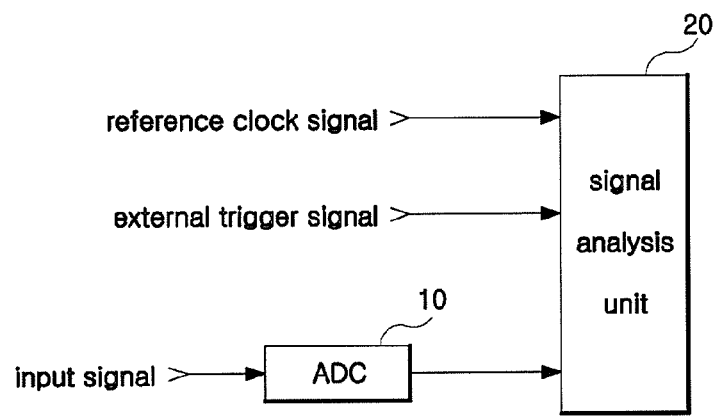
[Fig. 2]
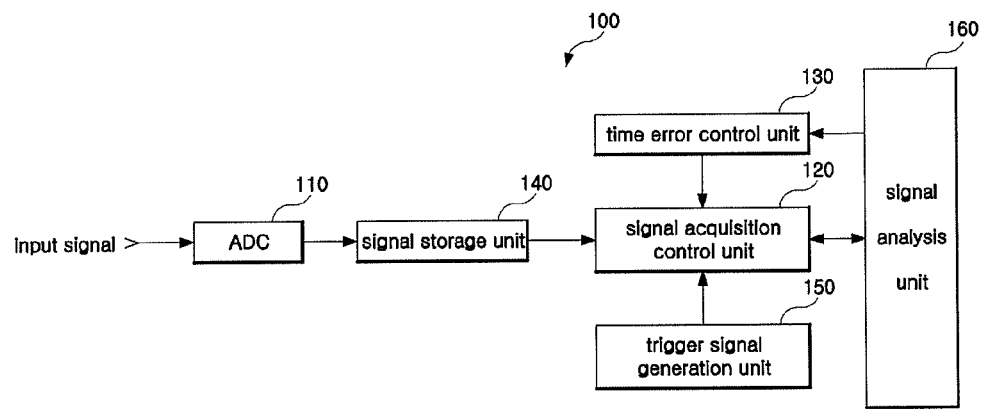

[Fig. 3]
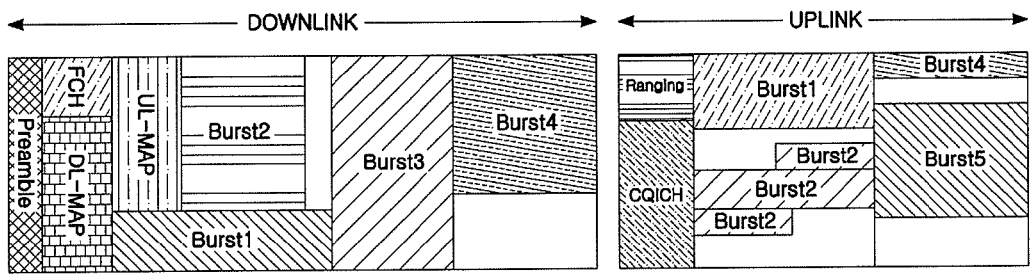
[Fig. 4]
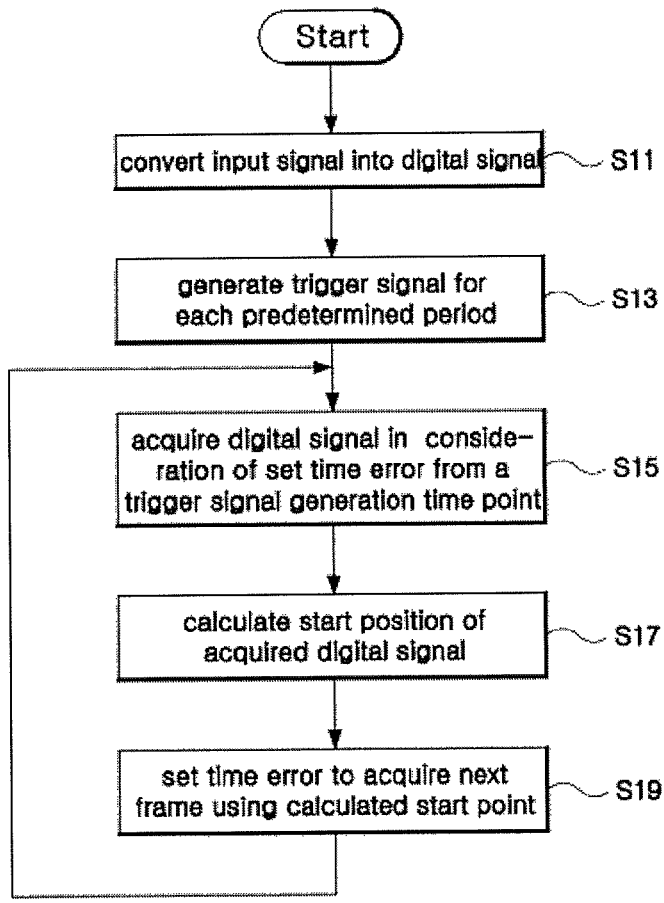

[Fig. 5]
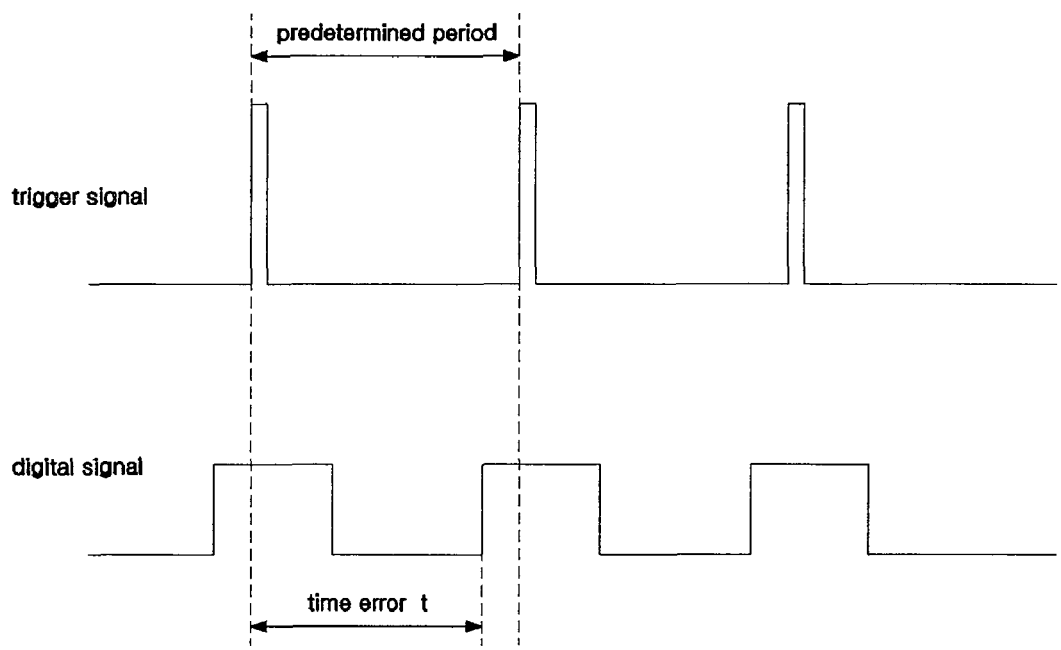

APPARATUS AND METHOD FOR SYNCHRONIZING SIGNAL ANALYZER

RELATED APPLICATIONS

The present disclosure relates to subject matter contained in priority Korean Application No. 10-2006-0073018, filed on 2 Aug. 2006 which is herein expressly incorporated by reference in its entirety.

BACKGROUND OF THE INVENTION

1. Field of the Invention

The present invention relates generally to an apparatus and method for synchronizing a signal analyzer and, more particularly, to an apparatus and method for synchronizing a signal analyzer, which, when the signal analyzer analyzes a signal input from the outside, can achieve the synchronization of the input signal in a short period without receiving a trigger signal from the outside.

2. Description of the Related Art

Generally, the term 'signal analyzer' refers to a measuring instrument that resolves the frequencies of an arbitrary input signal into sine waves and analyzes the components thereof, and may be classified as a spectrum analyzer, a network analyzer, a digital analyzer, a frequency analyzer and a wave analyzer according to the purpose of use.

FIG. 1 is a block diagram showing the construction of a conventional signal analyzer.

As shown in FIG. 1, a signal analysis unit 20 receives an input signal that is converted in digital form via an Analog-to-Digital Converter (ADC) 10, and receives reference clock signals and external trigger signals from the outside, that is, from the transmitter that transmitted the input signal, in order to analyze the input signal. In this case, the external trigger signals are signals that are used to acquire the synchronization of the input signal, and are signals that are input in conformity with the respective start positions of frames that constitute the input signal. Each of the reference clock signals is a signal that is input for use as a reference clock when various types of clocks to be used in a system are generated. That is, the signal analysis unit 20 analyzes a given number of frames of the input signal based on the external trigger signals and the reference clock signals.

However, in accordance with the conventional signal analyzer described above, the synchronization of the input signal cannot be acquired in an environment in which the external trigger signals cannot be received, for example, in a mobile communication base station, and thus there is a problem in that accurate signal analysis cannot be performed.

Furthermore, the start position of each frame can be calculated by installing a synchronization acquisition algorithm in the signal analyzer itself, rather than using the external trigger signals. In this case, each of the calculation intervals for synchronization acquisition is longer than a single frame, so that it takes a lot of time to acquire the synchronization of the input signal, therefore a problem exists in that the usefulness of the signal analyzer is limited.

SUMMARY OF THE INVENTION

Accordingly, the present invention has been made keeping in mind the above problems occurring in the prior art, and an object of the present invention is to provide an apparatus and method for synchronizing a signal analyzer, which internally generates a trigger signal, which is used as a reference point for signal acquisition, for each predetermined period, and enables both the acquisition of synchronization and tracking to be performed on the basis of the trigger signal.

In order to accomplish the above object, the present invention provides an apparatus for synchronizing a signal analyzer, the apparatus being applied to the signal analyzer for analyzing an input signal, the input signal being input from outside and having a frame structure, the apparatus including an Analog-to-Digital Converter (ADC) for converting the input signal into a corresponding digital signal; a signal storage unit for storing the digital signal received from the ADC; a trigger signal generation unit for generating a trigger signal for each predetermined period; a signal acquisition control unit for acquiring the digital signal, stored in the signal storage unit, from a signal acquisition time point that is preset on the basis of a trigger signal received from the trigger signal generation unit; a signal analysis unit for calculating the start position of a frame from the digital signal, which is received from the signal acquisition control unit; and a time error control unit for calculating a time error between the time point at which each trigger signal is generated and the start position of the digital signal in consideration of the start position, which is calculated by the signal analysis unit, and a clock error between a transmitter, which is used to transmit the input signal, and the signal analyzer, and setting a subsequent signal acquisition time point based on the calculated time errors. In this case, the apparatus for synchronizing a signal analyzer is applied to a Time Division Duplexing (TDD) system.

In addition, the present invention provides a method of synchronizing a signal analyzer, the method being performed in the signal analyzer for analyzing an input signal, the input signal being input from an outside and having a frame structure, the method including the steps of (a) converting the input signal into a digital signal; (b) storing the digital signal; (c) generating trigger signals for respective predetermined periods; (d) acquiring the digital signal, which is stored at the step (b), from an arbitrary time point on the basis of the time point at which each trigger signal is generated; (e) calculating the start position of a frame from the digital signal acquired at step (d); and (f) setting an acquisition time point for the digital signal acquired at step (d), based on the start position of each frame calculated at the step (e).

BRIEF DESCRIPTION OF THE DRAWINGS

The above and other objects, features and advantages of the present invention will be more clearly understood from the following detailed description taken in conjunction with the accompanying drawings, in which:

FIG. 1 is a block diagram showing the construction of a conventional signal analyzer;

FIG. 2 is a block diagram showing the construction of an apparatus for synchronizing a signal analyzer according to an embodiment of the present invention;

FIG. 3 is a chart showing the structure of transmission frames in an OFDM-based WiBro system;

FIG. 4 is a flowchart illustrating a method of synchronizing a signal analyzer according to an embodiment of the present invention; and FIG. 5 is a diagram showing an example of signal waveforms for illustrating a process of synchronizing an input signal based on the present invention.

DESCRIPTION OF THE PREFERRED EMBODIMENTS

The apparatus and method for synchronizing a signal analyzer according to preferred embodiments of the present invention are described in detail with reference to the accompanying drawings below.

FIG. 2 is a block diagram showing the construction of an apparatus for synchronizing a signal analyzer according to an embodiment of the present invention.

As shown in FIG. 2, the apparatus 100 for synchronizing a signal analyzer includes an ADC 110 for converting an analog input signal into a digital signal, a signal storage unit 140 for storing the digital signal received from the ADC 110, a trigger signal generation unit 150 for generating a trigger signal, which is used as a reference point for signal acquisition for each predetermined period, for example, for a period of 5□, which corresponds to a single frame of a Wireless Broadband (WiBro) system developed by South Korea, a signal acquisition control unit 120 for acquiring the signal of the signal storage unit 140 from a 'signal acquisition time point,' which is preset on the basis of a trigger signal received from the trigger signal generation unit 150, a signal analysis unit 160 for calculating the start position of a frame from the digital signal, which is received from the signal acquisition control unit 120, and analyzing the frame, and a time error control unit 130 for calculating a 'time error' between the time point at which each trigger signal is generated and the start position of a the digital signal in consideration of the start position, which is received from the signal analysis unit 160, and a clock error, which may occur between a transmitter and a receiver, and setting a 'signal acquisition time point,' which will be applied at the time of acquiring the next frame, based on the calculated time error. That is, the time error control unit 130 sets a signal acquisition time point for each frame. The signal acquisition control unit 120 acquires the signal of the signal storage unit 140 from the signal acquisition time point, which is set by the time error control unit 130, based on the trigger signal received from the trigger signal generation unit 150. In this manner, a tracking process of acquiring the synchronization of an input signal is performed between the time error control unit 130 and the signal acquisition control unit 120. Accordingly, the signal analysis unit 160 can rapidly perform the acquisition of synchronization and tracking on the digital signal, which is input from the signal acquisition control unit 120, through the tracking process.

In the above-described construction, the signal analysis unit 160 includes a synchronization acquisition algorithm for calculating the start location of a frame received from the signal acquisition control unit 120, a series of algorithms for signal analysis, and a part for transmitting a signal acquisition command to the signal acquisition control unit 120 to read data to be analyzed. The time error control unit 130 includes a part for notifying the signal acquisition control unit 120 of the start position from which the next frame is acquired based on the set 'signal acquisition time point.' Accordingly, when a signal acquisition command is received from the signal analysis unit 160, the signal acquisition control unit 120 outputs the data of the signal storage unit 140 to the signal analysis unit 160 from the start position, which is received from the time error control unit 130, on the basis of a trigger signal corresponding to this command.

Here, it is preferred that the apparatus 100 for synchronizing a signal analyzer be applied to a Time Division Duplexing (TDD) system, which transmits and receives signals in a duplex manner, or an Orthogonal Frequency Division Multiple (OFDM) system, which transmits and receives signals in a multiple access manner.

FIG. 3 is a chart showing the structure of transmission frames in an OFDM-based WiBro system. As shown in FIG. 3, in the OFDM-based WiBro system, data information is represented in the time domain (transversal axis) and in the frequency domain (longitudinal axis). An uplink region and a downlink region, that is, a left region and a right region, are distinguished from each other using the time, as shown in the drawing.

In the above-described structure, the uplink region may be divided into a preamble section, a Frame Control Header (FCH) section, a DownLink-MAP (DL-MAP) section, an UpLink-MAP (UL-MAP) section, and a data transmission section. In this case, data transmitted during the preamble section includes a signal for synchronization and a signal for cell division, and is information that must be first considered when a WiBro terminal receives data. According to a standard, codes that are transmitted in the preamble section are classified into a total of 114 types. The WiBro terminal selects the preamble code having the highest correlation from among the 114 preamble codes and then uses information of the selected preamble code, so that it can access the FCH section.

Subsequently, data in the FCH section includes information that is necessary to demodulate the DL-MAP data, such as the method that is used to modulate the data of DL-MAP and the encoding method that is used. In contrast, the DL-MAP data designates a data section and a modulation method, which are assigned to each WiBro terminal in the UL-MAP section and the data transmission section. In addition, the DL-MAP data includes information about the IDentification (ID) number of a base station selected by the WiBro terminal.

FIG. 4 is a flowchart illustrating a method of synchronizing a signal analyzer according to an embodiment of the present invention, and FIG. 5 is a diagram showing an example of signal waveforms for illustrating a process of synchronizing an input signal based on the present invention.

First, at step S11, the ADC 110 converts an analog input signal into a digital signal and then outputs the digital signal, and at step 13, the trigger signal generation unit 150 generates a trigger signal for each predetermined period, for example, for a period of 5□, which is the period of the input signal.

Thereafter, at step S15, the signal acquisition control unit 120 acquires the signal, which is stored in the storage unit 140, by a desired length from a 'signal acquisition time point,' which is preset on the basis of a corresponding input trigger signal, and outputs the acquired signal to the signal analysis unit 160.

Thereafter, at step S17, the signal analysis unit 160 calculates the start position of a frame from the digital signal, which is received from the signal acquisition control unit 120, based on an installed synchronization acquisition algorithm. For example, in the case where the input signal is a frame that is transmitted from the WiBro system, the signal analysis unit 160 detects a preamble section from the digital signal, which is received from the signal acquisition control unit 120, on the basis of the time point at which each trigger signal is generated.

Thereafter, at step S19, the time error control unit 130 sets a 'signal acquisition time point,' which will be applied at the time of acquiring the next frame signal, using a time value for which a clock error, which may occur between the transmitter and the receiver for which clock synchronization is not performed, and the start position of the frame, which is calculated at step S17, are considered. That is, as shown in FIG. 5, the time error control unit 130 obtains the time error 't', which is generated due to mismatching between the start position of the trigger signal and the start position of the digital signal.

Accordingly, the signal acquisition control unit 140 acquires the signal of the signal storage unit 140 by a desired length from the 'signal acquisition time point,' which is set at step S19, on the basis of the input trigger signal, and outputs the acquired signal to the signal analysis unit 160. Accordingly, the signal analysis unit 160 can perform the acquisition of synchronization and tracking without receiving the trigger signal or a reference clock signal from the outside.

The apparatus and method for synchronizing a signal analyzer according to the present invention is not limited only to the above-described embodiments, and may be modified and implemented in various ways within the range permitted by the technological spirit of the present invention.

As described above, in accordance with the apparatus and method for synchronizing a signal analyzer according to the present invention, the range of use of the signal analyzer is widened due to the effect in which a trigger signal is internally generated for each predetermined period and the input signal seems to be synchronized with the trigger signals. That is, the present invention is appropriate for a wireless environment, so that it has an effect in that signal analysis can be performed regardless of place and time using only the signal analyzer, rather than using any external trigger signal or any clock synchronization signal.

Furthermore, the signal analysis unit receives the digital signal from the signal acquisition control unit from a location for which the start position of each preamble is considered, so that the calculation time necessary for the acquisition of synchronization is greatly reduced, therefore the signal analysis unit can directly analyze the input digital signal.

In addition, when each frame is analyzed by the time error control unit, tracking can be performed while maintaining synchronization time without receiving the trigger signal or the reference clock signal from the outside, through a process of setting a time error value, which will be applied at the time of acquiring the next frame signal using a time value, for which a clock error, which may occur between the transmitter and the receiver on which clock synchronization is not performed, and the start value of the preamble are considered.

What is claimed is:

1. An apparatus for synchronizing a signal analyzer, the apparatus being applied to the signal analyzer for analyzing an input signal, the input signal being input from outside the signal analyzer and having a frame structure, the apparatus comprising:
    an Analog-to-Digital Converter (ADC) configured to convert the input signal into a corresponding digital signal;
    a signal storage unit configured to store the digital signal received from the ADC;
    a trigger signal generation unit configured to generate a trigger signal for each predetermined period;
    a signal acquisition control unit configured to acquire the digital signal, stored in the signal storage unit, from a signal acquisition time point that is preset on a basis of a trigger signal received from the trigger signal generation unit;
    signal analysis unit configured to calculate a start position of a frame from the digital signal, which is received from the signal acquisition control unit, the signal analysis unit including a synchronization acquisition algorithm, a series of algorithms for signal analysis, and a part for transmitting a signal acquisition command; and
    a time error control unit configured to (a) calculate a time error between a time point at which each trigger signal is generated and the start position of the frame of the digital signal, in consideration of the start position of the frame calculated by the signal analysis unit, and (b) set a subsequent signal acquisition time point based on the calculated time errors.

2. The apparatus as set forth in claim 1, wherein the apparatus for synchronizing a signal analyzer is applied to a Time Division Duplexing (TDD) system.

3. A method of synchronizing a signal analyzer, the method being performed in the signal analyzer for analyzing an input signal, the input signal being input from outside the signal analyzer and having a frame structure, the method comprising the steps of:
    (a) converting the input signal into a digital signal;
    (b) storing the digital signal;
    (c) generating trigger signals for respective predetermined periods;
    (d) acquiring the digital signal, which is stored at the step (b), from a signal acquisition time point on a basis of a time point at which each trigger signal is generated;
    (e) calculating a start position of a frame from the digital signal acquired at step (d) based on a synchronization acquisition algorithm;
    (f) calculating a time error between a time point at which each trigger signal is generated and the start position of the frame of the digital signal, in consideration of the start position of the frame calculated at the step (e);
    (g) setting a subsequent signal acquisition time point for the digital signal acquired at step (d), based on the calculated time errors; and
    (h) transmitting a signal acquisition command to acquire a subsequent digital signal based on the subsequent signal acquisition time point.

* * * * *